United States Patent
Arai et al.

(10) Patent No.: US 8,901,580 B2
(45) Date of Patent: Dec. 2, 2014

(54) PACKAGE FOR MOUNTING ELECTRONIC COMPONENTS, ELECTRONIC APPARATUS, AND METHOD FOR MANUFACTURING THE PACKAGE

(71) Applicant: Shinko Electric Industries Co., Ltd., Nagano-shi, Nagano (JP)

(72) Inventors: Tadashi Arai, Nagano (JP); Yasuyuki Kimura, Nagano (JP); Toshio Kobayashi, Nagano (JP); Kazutaka Kobayashi, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 148 days.

(21) Appl. No.: 13/682,107

(22) Filed: Nov. 20, 2012

(65) Prior Publication Data

US 2013/0126916 A1    May 23, 2013

(30) Foreign Application Priority Data

Nov. 22, 2011   (JP) .................................. 2011-254899

(51) Int. Cl.
| | | |
|---|---|---|
| *H01L 27/15* | (2006.01) | |
| *H01L 21/50* | (2006.01) | |
| *H01L 23/495* | (2006.01) | |
| *H01L 25/075* | (2006.01) | |
| *H01L 23/00* | (2006.01) | |
| *H01L 33/48* | (2010.01) | |
| *H01L 33/62* | (2010.01) | |
| *H01L 33/64* | (2010.01) | |

(52) U.S. Cl.
CPC .......... *H01L 27/15* (2013.01); *H01L 23/49568* (2013.01); *H01L 21/50* (2013.01);

(Continued)

(58) Field of Classification Search
CPC ............. H01L 2224/49111; H01L 2924/0665; H01L 23/49861
USPC ....... 257/88, 98, 666, 675, E33.045, E23.052
See application file for complete search history.

(56) References Cited

U.S. PATENT DOCUMENTS

| | | |
|---|---|---|
| 2002/0109211 A1 | 8/2002 | Shinohara |
| 2008/0298063 A1 | 12/2008 | Hayashi |

(Continued)

FOREIGN PATENT DOCUMENTS

| | | |
|---|---|---|
| EP | 1909324 | 4/2008 |
| JP | 2001-210764 | 8/2001 |
| JP | 2006-134992 | 5/2006 |

OTHER PUBLICATIONS

Partial European Search Report, Application No. 12193921.9 dated Nov. 25, 2013, 6 pages.
European Search Report, Application No. 12193921.9, dated Jan. 30, 2014, 15 pages.

*Primary Examiner* — Cathy N Lam
(74) *Attorney, Agent, or Firm* — Rankin, Hill & Clark LLP

(57) ABSTRACT

A package includes: a leadframe made of conductive material and on which the plurality of electronic components are to be mounted, the leadframe including a first surface and a second surface opposite to the first surface and including a plurality of elongate portions arranged in parallel to each other with a gap interposed between the adjacent elongate portions; a heat sink including a first surface and a second surface opposite to the first surface, wherein the leadframe is disposed above the heat sink such that the second surface of the leadframe faces the first surface of the heat sink; and a resin portion, wherein the leadframe and the heat sink are embedded in the resin portion such that the first surface of the leadframe and the second surface of the heat sink are exposed from the resin portion, respectively.

14 Claims, 18 Drawing Sheets

(52) U.S. Cl.
CPC ............ *H01L 25/0753* (2013.01); *H01L 24/19*
(2013.01); *H01L 33/486* (2013.01); *H01L 33/62*
(2013.01); *H01L 33/64* (2013.01); *H01L*
*2224/45147* (2013.01); *H01L 2224/45144*
(2013.01); *H01L 2224/16245* (2013.01); *H01L*
*2224/48091* (2013.01); *H01L 2924/19107*
(2013.01); *H01L 2924/01047* (2013.01)
USPC ........ 257/88; 257/98; 257/666; 257/E33.045;
257/E23.052

(56) References Cited

U.S. PATENT DOCUMENTS

| | | |
|---|---|---|
| 2009/0050908 A1 | 2/2009 | Yuan et al. |
| 2010/0207142 A1 | 8/2010 | Chen et al. |
| 2012/0161180 A1* | 6/2012 | Komatsu et al. ................ 257/98 |
| 2012/0181675 A1* | 7/2012 | Jeon et al. ..................... 257/666 |

* cited by examiner

US 8,901,580 B2

PACKAGE FOR MOUNTING ELECTRONIC COMPONENTS, ELECTRONIC APPARATUS, AND METHOD FOR MANUFACTURING THE PACKAGE

This application claims priority from Japanese Patent Application No. 2011-254899, filed on Nov. 22, 2011, the entire contents of which are herein incorporated by reference.

BACKGROUND

1. Technical Field

The present invention relates to a package for mounting electronic components capable of mounting a plurality of electronic components, an electronic apparatus in which a plurality of electronic components is mounted on the package for mounting electronic components, and a method for manufacturing these packages.

2. Related Art

In recent years, light emitting diodes (hereinafter referred to as LEDs) that have low power consumption and long service life are attracting attention as a power source. For example, an LED module that mounts a plurality of LEDs is proposed (see e.g., JP-A-2006-134992).

Incidentally, since the heat generated when the LEDs emit light increases as the number of LEDs to be mounted on the LED module increases, an efficient heat dissipation structure is needed. However, since efficient heat dissipation structures are not proposed in LED modules of the related art, the heat emitted when a number of LEDs are mounted cannot be efficiently dissipated.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any disadvantages described above.

The invention has been made in view of the above points, and an object thereof is to provide a package for mounting electronic components having excellent heat dissipation performance, an electronic apparatus having excellent heat dissipation performance, in which a plurality of electronic components is mounted on the package for mounting electronic components, and a method for manufacturing these packages.

According to one or more illustrative aspects of the present invention, there is provided a package for mounting a plurality of electronic components. The package comprises: a leadframe made of conductive material and on which the plurality of electronic components are to be mounted, the leadframe comprising a first surface and a second surface opposite to the first surface and comprising a plurality of elongate portions arranged in parallel to each other with a gap interposed between the adjacent elongate portions; a heat sink comprising a first surface and a second surface opposite to the first surface, wherein the leadframe is disposed above the heat sink such that the second surface of the leadframe faces the first surface of the heat sink; and a resin portion, wherein the leadframe and the heat sink are embedded in the resin portion such that the first surface of the leadframe and the second surface of the heat sink are exposed from the resin portion, respectively, wherein the respective gaps between the adjacent elongate portions are filled with the resin portion.

According to one or more illustrative aspects of the present invention, there is provided an electronic apparatus. The electronic apparatus comprises: a plurality of electronic components; and the package that mounts the plurality of electronic components thereon.

According to one or more illustrative aspects of the present invention, there is provided a method for manufacturing a package for mounting a plurality of electronic components. The method comprises: (a) forming a leadframe made of conductive material and on which the plurality of electronic components are to be mounted, the leadframe comprising a first surface and a second surface opposite to the first surface and comprising a plurality of elongate portions arranged in parallel to each other with a gap interposed between the adjacent elongate portions; (b) providing a heat sink comprising a first surface and a second surface opposite to the first surface; (c) disposing the leadframe above the heat sink such that the second surface of the leadframe faces the first surface of the heat sink; and (d) embedding the leadframe and the heat sink in a resin portion such that the first surface of the leadframe and the second surface of the heat sink are exposed from the resin portion, respectively, wherein the respective gaps between the adjacent elongate portions are filled with the resin portion.

Other aspects and advantages of the present invention will be apparent from the following description, the drawings and the claims.

DETAILED DESCRIPTION OF EXEMPLARY EMBODIMENTS

Figure 1A:
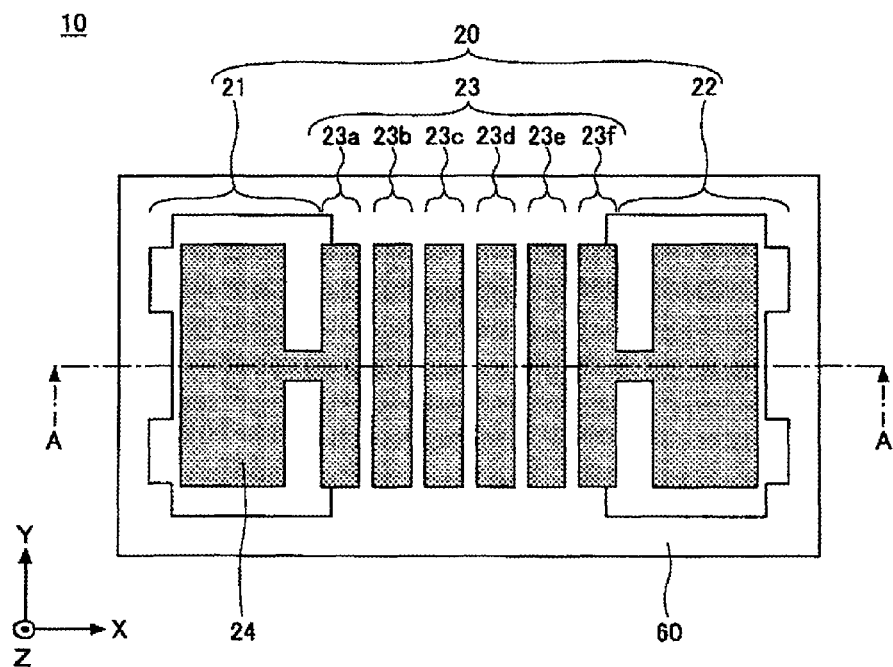
FIGS. 1A and 1B are views illustrating a package for mounting electronic components according to a first embodiment.

Hereinafter, exemplary embodiments of the present invention will be described with reference to the accompanying drawings. In all the drawings for the explanation of the embodiments, the members having the same functions are represented by the same reference numerals, and repeated description thereof will be omitted.

First Embodiment

Figure 1B:
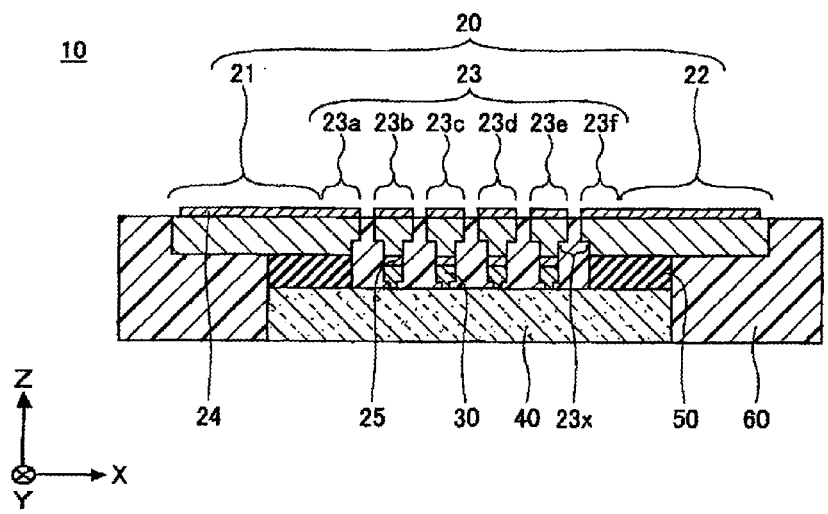

First, the structure of a package for mounting electronic components according to a first embodiment will be described. FIGS. 1A and 1B are views illustrating the package for mounting electronic components according to the first embodiment, FIG. 1A is a plan view, and FIG. 1B is a cross-sectional view along line A-A of FIG. 1A. Referring to FIGS. 1A and 1B, a package 10 for mounting electronic components generally has a leadframe 20, bumps 30, a heat sink 40, a bonding portion 50, and a resin portion 60. In addition, for convenience, FIG. 1A shows a plating film 24 in a satin form (may be also the same in other drawings).

The leadframe 20 is a conductive base formed, for example, by performing stamping, etching, or the like on a thin metal sheet, and has a first electrode portion 21, a second electrode portion 22, and an electronic component mounting portion 23. As the material of the leadframe 20, copper (Cu), copper alloys, 42 alloys (alloys of Fe and Ni), or the like can be used. The thickness of the leadframe 20 can be, for example, 100 μm (about 100 to 250 μm).

The first electrode portion 21 and the second electrode portion 22 are, for example, connected to a power source, a drive circuit that are arranged outside the package 10 for mounting electronic components. In the electronic component mounting portion 23, elongate portions 23a to 23f that are electrically independent from each other are arranged in parallel at predetermined intervals and are sandwiched between the first electrode portion 21 and the second electrode portion 22.

The first electrode portion 21 is electrically connected to the elongate portion 23a that is arranged at one end in an array direction (X direction) of the elongate portions. The second electrode portion 22 is electrically connected to the elongate portion 23f that is arranged at the other end in the array direction (X direction) of the elongate portions. In the present embodiment, the elongate portion 23a is one end portion of the first electrode portion 21, and the elongate portion 23f is one end portion of the second electrode portion 22. That is, the first electrode portion 21 and the elongate portion 23a are integrally formed, and the second electrode portion 22 and the elongate portion 23f are integrally formed.

In addition, as will be described below, the first electrode portion 21 and the second electrode portion 22 are not necessarily arranged on both sides of the electronic component mounting portion 23, and a metal sheet may be machined into a predetermined shape and the first electrode portion 21 and the second electrode portion 22 may be arranged on any one side of the electronic component mounting portion 23.

The electronic component mounting portion 23 is configured to mount a plurality of electronic components in parallel between adjacent elongate portions along the longitudinal direction (Y direction) of the elongate portions. For example, the electronic component mounting portion is configured to mount a plurality of electronic components in parallel along the longitudinal direction of the elongate portions between adjacent elongate portions 23a and 23b. This is also the same between adjacent elongate portions 23b and 23c, between adjacent elongate portions 23c and 23d, between adjacent elongate portions 23d and 23e, and between adjacent elongate portions 23e and 23f.

In addition, the electronic component mounting portion is configured to mount a plurality of electronic components in series between adjacent elongate portions along the array direction (X direction) of the elongate portions. For example, the electronic component mounting portion is configured to mount electronic components (five electronic components in this case) in series between adjacent elongate portions 23a and 23b, between adjacent elongate portions 23b and 23c, between adjacent elongate portions 23c and 23d, between adjacent elongate portions 23d and 23e, and between adjacent elongate portions 23e and 23f.

The elongate portions 23a to 23f are made of, for example, metal sheets that are lengthy or oblong in plan view, and are arranged at predetermined intervals so that the long sides of the respective elongate portions face each other. If the lengths of respective long and short sides of the elongate portions 23a to 23f and the interval between adjacent elongate portions are mentioned as an example, the length of the long sides is 10 mm (about 5 to 10 mm), the length of the short sides are 1 mm (about 1 to 5 mm), and the interval is 60 μm (about 50 to 100 μm).

A plating film 24 is formed on a portion of one surface of each of the first electrode portion 21 and the second electrode portion 22, and on the whole of one surface of each of the elongate portions 23a to 23f. In addition, a plating film 25 is formed on the whole of the other surface of each of the elongate portions 23b to 23e. The purpose of forming the plating films 24 and 25 is to improve connection reliability with members or the like to be connected to respective portions.

In addition, the region of one surface of the leadframe 20 where the plating film 24 is not formed may be coated with insulating materials, such as solder resist. In this case, as the insulating materials, such as solder resist, in order to raise the reflectance of the light emitted from a light emitting element, it is suitable to use a white material in which fillers, such as titanium oxide, are contained.

As the plating films 24 and 25, for example, Ni or Ni alloy/Au or Au alloy films, Ni or Ni alloy/Pd or Pd alloy/Au or Au alloy films, Ni or Ni alloy/Pd or Pd alloy/Ag or Ag alloy/Au or Au alloy films, an Ag or Ag alloy film, Ni or Ni alloy/Ag or Ag alloy films, and Ni or Ni alloy/Pd or Pd alloy/Ag or Ag alloy films can be used, respectively. In addition, the "AA/BB films" mean that an AA film and a BB film are formed so as to be laminated in this order on a target portion (that is also the same in the case of three or more layers).

The film thickness of the Au or Au alloy film and the Ag or Ag alloy film in the plating films 24 and 25 is preferably set to 0.1 μm. The film thickness of the Pd or Pd alloy film in the plating films 24 and 25 is preferably set to 0.005 μm. The film thickness of the Ni or Ni alloy film in the plating films 24 and 25 is preferably set to 0.5 μm.

A stepped portion 23x is formed on the other surface of each of the elongate portions 23b to 23e. Since insulating resin that is the material of the resin portion 60 enters the stepped portion 23x by forming the stepped portion 23x, the adhesion property between the leadframe 20 and the resin portion 60 can be improved by an anchor effect.

A plurality of bumps 30 is formed on the plating film 25 of the other surface of each of the elongate portions 23b to 23e along the longitudinal direction thereof. When electronic components are mounted on the leadframe 20, the plurality of bumps 30 is provided in order to transfer the heat, which is emitted from the electronic components, to the heat sink 40.

The planar shape of each bump 30 can be, for example, circular, and the diameter in that case can be, for example, about 10 to 250 μm. A small-diameter projection portion is formed on the heat sink 40 side of each bump 30, and the tip of the projection portion comes into close contact with one surface of the heat sink 40. The height of the bump 30 also including the projection portion can be, for example, about 50 to 100 μm. As the material of each bump 30, a material with high thermal conductivity is preferably used, for example, copper (Cu), gold (Au), or the like can be used.

The heat sink 40 is arranged at a position that overlaps the electronic component mounting portion 23 in plan view, and is bonded to the other surface of each of the first electrode portion 21 and the second electrode portion 22 via the bonding portion 50. That is, the electronic component mounting portion 23 is arranged on the heat sink 40.

As the material of the heat sink 40, a material with high thermal conductivity is preferably used. For example, ceramics, such as alumina ($Al_2O_3$) and aluminum nitride (AlN), or silicon (Si) having a surface coated with an insulating film, such as an oxidized film ($SiO_2$), can be used. The thickness of the heat sink 40 can be, for example, 300 μmm (about 100 to 500 μm). However, in a case where heat dissipation properties are required, a thickness of about several millimeters may be adopted. As the material of the bonding portion 50, for example, adhesives, such as epoxy-based or silicone-based insulating resin, can be used.

The leadframe 20, the bumps 30, the heat sink 40, and the bonding portion 50 are embedded in the resin portion 60. However, one surface (surface on which the plating film 24 is formed) of the leadframe 20, and the other surface (surface that does not come in contact with the bumps 30) of the heat sink 40 are exposed from the resin portion 60.

That is, the resin portion 60 is filled between the elongate portions 23a to 23f, the top surfaces of the elongate portions 23a to 23f are exposed from the top surface of the resin portion 60, and the side surfaces of the elongate portions 23a to 23f are covered with the resin portion 60. The first electrode portion 21 and the second electrode 22 are embedded in the resin portion 60 such that the side surfaces of the first electrode portion 21 and the second electrode 22 are covered with the resin portion 60 while the top surfaces of the first electrode portion 21 and the second electrode 22 are exposed from the resin portion 60. In addition, the side surface of the heat sink 40 is covered with the resin portion 60, and the bottom surface of the heat sink 40 is exposed from the bottom surface of the resin portion 60. In addition, the top surface of the resin portion 60 can be formed to be flush with the top surfaces of the elongate portions 23a to 23f, and the bottom surface of the resin portion 60 can be formed to be flush with the bottom surface of the heat sink 40. In addition, since the plating film 24 is ultra-thin, the thickness of the plating film 24 is negligible.

As the material of the resin portion 60, for example, epoxy-based or silicone-based insulating resin, or the like can be used. The resin portion 60 may contain fillers, such as alumina. In addition, in a case where light emitting elements, such as LEDs, are mounted as electronic components, in order to raise the reflectance of the light emitted from the light emitting elements, it is suitable to make the resin portion 60 white by making fillers, such as titanium oxide, be contained therein. In addition, instead of titanium oxide, the resin portion 60 may be made white using a pigment of $TiO_2$, $BaSO_4$, or the like.

Figure 2A:
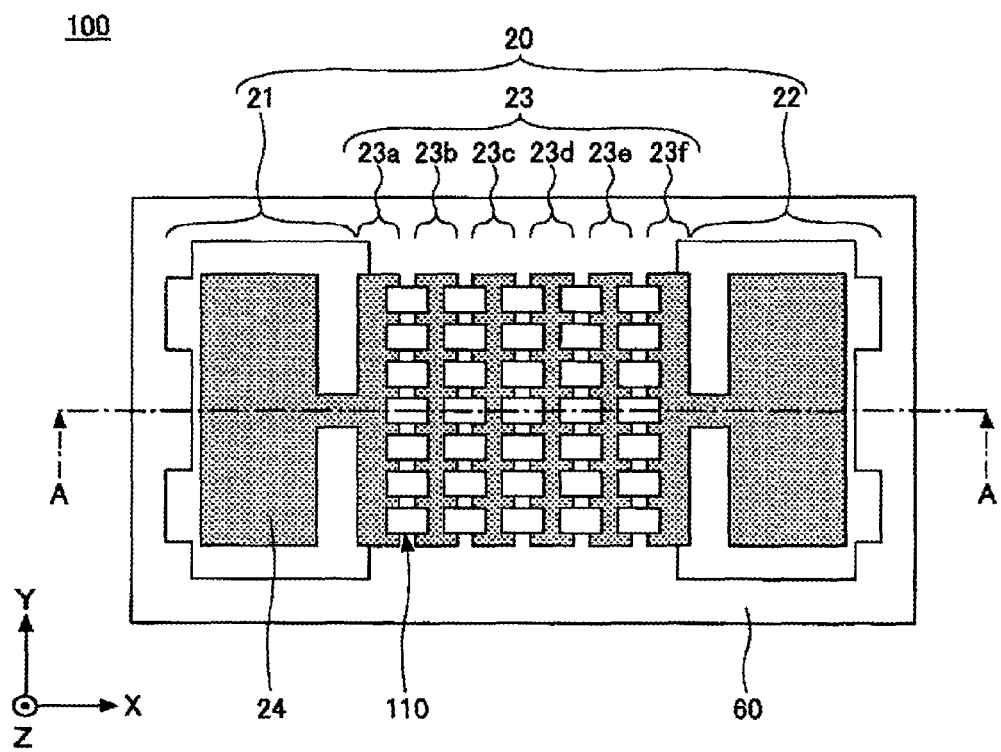
FIGS. 2A and 2B are views illustrating an electronic apparatus which includes the package and a plurality of electronic components mounted on the package according to the first embodiment.
Figure 2B:
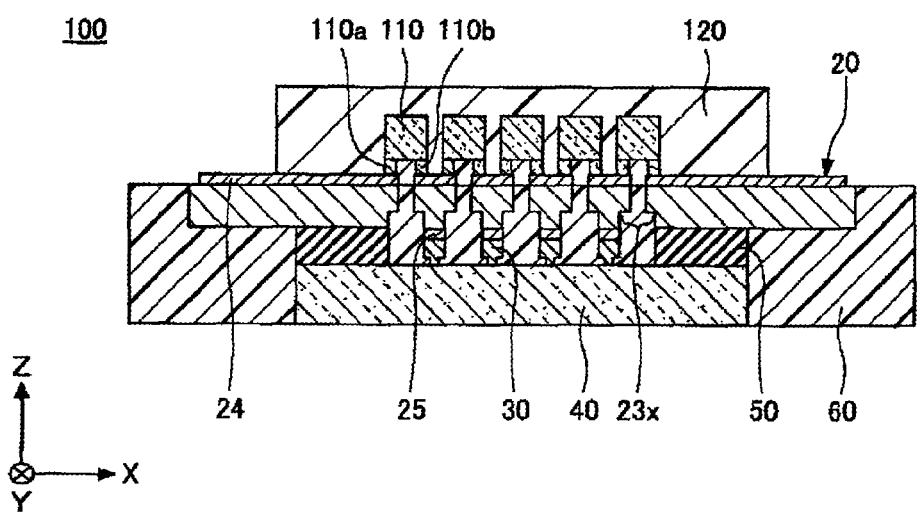

FIGS. 2A and 2B are views illustrating an electronic apparatus according to the first embodiment, FIG. 2A is a plan view, and FIG. 2B is a cross-sectional view along the line A-A of FIG. 2A. However, in FIG. 2A, an encapsulating resin 120 shown in FIG. 2B is omitted.

Referring to FIG. 2, an electronic apparatus 100 mounts a plurality of electronic components 110 longitudinally and laterally between adjacent elongate portions of the package 10 for mounting electronic components, and encapsulates the electronic components with the encapsulating resin 120. However, the encapsulating resin 120 is formed so as to expose a portion of each of the first electrode portion 21 and the second electrode portion 22.

As the electronic components 110, light emitting elements can be used. As the light emitting elements, for example, LEDs can be used in which an anode terminal is formed on one end side and a cathode terminal is formed on the other end side. However, the light emitting elements are not limited to LEDs, and for example, surface-emitting lasers or the like may be used. As the encapsulating resin 120, for example, insulating resin based on epoxy, silicone, which contains a fluorescent substance can be used.

Description will be made below, taking as an example a case where the electronic components 110 are LEDs and the electronic apparatus 100 is an LED module (the electronic component 110 may be referred to as LEDs 110, and the electronic apparatus 100 may be referred to as the LED module 100).

To take an example of the dimensions of the LEDs 110 to be mounted on the electronic component mounting portion 23, in plan view, there are height of 0.3 mm (Y direction)× width of 0.3 mm (X direction), height of 1.0 mm (Y direction)×width of 1.0 mm (X direction), and height of 1.5 mm (Y direction)×width of 1.5 mm (X direction).

Each LED 110 is formed with a bump 110a that becomes one electrode terminal, and a bump 110b that becomes the other electrode terminal. Any one the bumps 110a and 110b of each LED 110 is an anode terminal and the other is a cathode terminal. For example, the bumps 110a and 110b may be flip-chip bonded to adjacent elongate portions. The respective LEDs 110 are mounted in the same direction (for example, so that anode terminals are located on the left of the drawing).

The interval between adjacent elongate portions of the electronic component mounting portion 23 is made approximately equal to the interval (for example, 60 μm) between the bumps 110a and 110b of the LEDs 110 to be mounted. Thereby, the LEDs 110 can be mounted in series between the elongate portion 23a and the elongate portion 23b, between the elongate portion 23b and the elongate portion 23c, between the elongate portion 23c and the elongate portion 23d, between the elongate portion 23d and the elongate portion 23e, and between the elongate portion 23e and the elongate portion 23f (X direction).

In addition, the length of each of the elongate portions 23a to 23f in the longitudinal direction (Y direction) is set to be about several times to several tens of times the length of the LED 110 in the Y direction. Thereby, a plurality of LEDs 110 can be mounted in parallel between the elongate portion 23a and the elongate portion 23b (Y direction). This is also the same between the elongate portion 23b and the elongate portion 23c, between the elongate portion 23c and the elongate portion 23d, between the elongate portion 23d and the elongate portion 23e, and between the elongate portion 23e and the elongate portion 23f. For example, about several tens to several hundreds of LEDs 110 in total can be mounted on the package 10 for mounting electronic components.

Next, a method for manufacturing the package for mounting electronic components according to the first embodiment will be described. FIGS. 3 to 14B are views illustrating processes for manufacturing the package for mounting electronic components according to the first embodiment.

Figure 3:
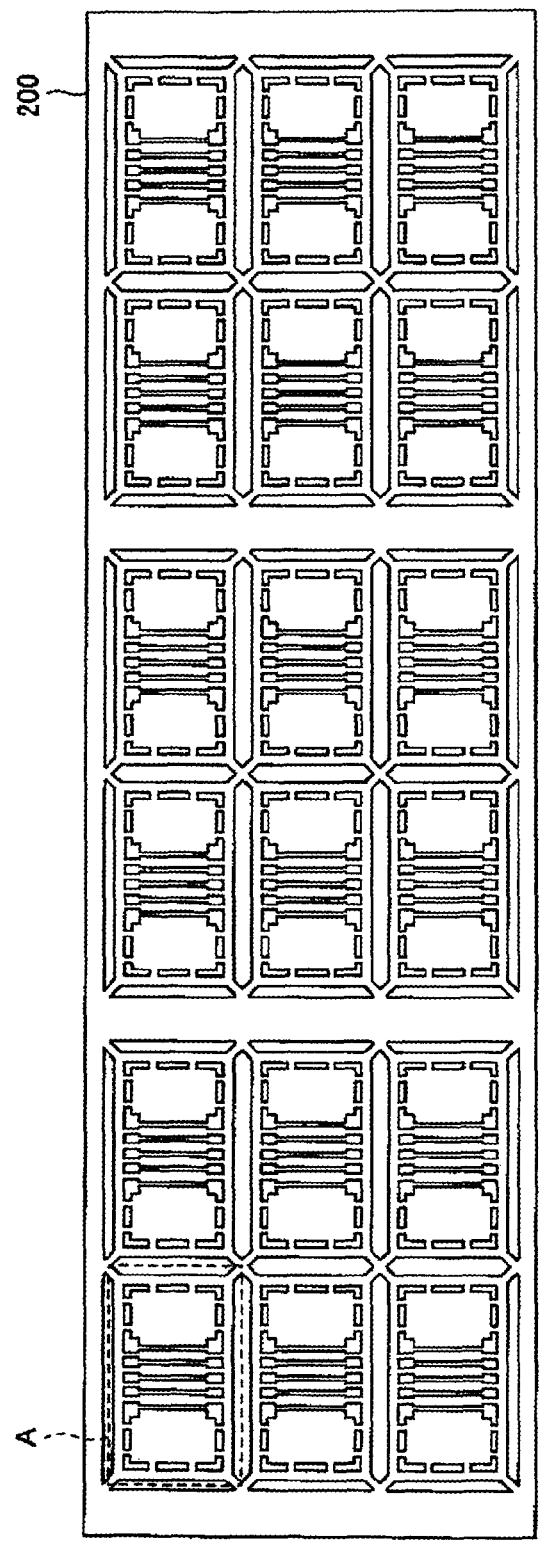
FIG. 3 is a view (#1) illustrating a process for manufacturing the package.
Figure 4:
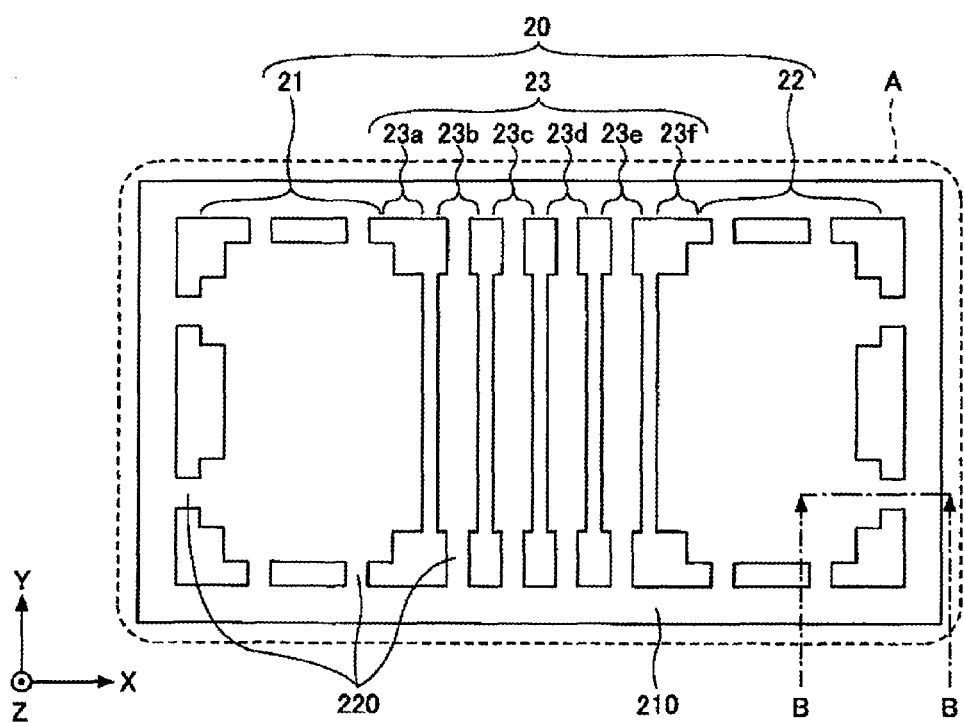
FIG. 4 is a view (#2) illustrating a process for manufacturing the package.
Figure 5:
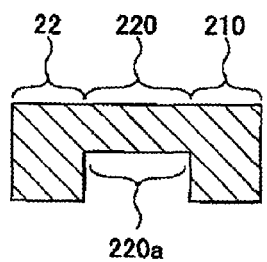
FIG. 5 is a view (3) illustrating a process for manufacturing the package.

First, a leadframe 200 is formed in the processes shown in FIGS. 3 to 5. The leadframe 200 can be formed, for example, by performing stamping, etching, or the like on a thin metal sheet. The leadframe 200 has a plurality of portions that eventually becomes the leadframe 20 of one package 10 for mounting electronic components. As the material of the leadframe 200, copper (Cu), copper alloys, 42 alloys (alloys of Fe and Ni), or the like can be used. The thickness of the leadframe 200 can be, for example, 100 μm (about 100 to 250 μm).

A portion A shown by broken lines in FIG. 3 represents a portion that eventually becomes one leadframe 20, and its peripheral portion. FIG. 4 is an enlarged view of the portion A of FIG. 3. The portion A has the structure in which the portion that becomes the leadframe 20 is supported by a plurality of connecting portions 220 formed at a frame portion 210.

FIG. 5 is a cross-sectional view taken along line B-B of FIG. 4. As shown in FIG. 5, since half etching, half cutting work, or the like is performed on a rear surface 220a of each connecting portion 220, the thickness of each connecting portion 220 is smaller than the thickness of other portions. This is to allow easy removal of the respective connecting portions 220 in a process to be described below. Respective processes will be described below, with the portion A being enlarged. In addition, for convenience, reference numerals for final constituent elements will be given to portions that eventually become respective constituent elements of the leadframe 20. For example, reference numeral 21 is given to a portion that eventually becomes the first electrode portion 21 of the leadframe 20 even in the middle of a process.

Figure 6A:
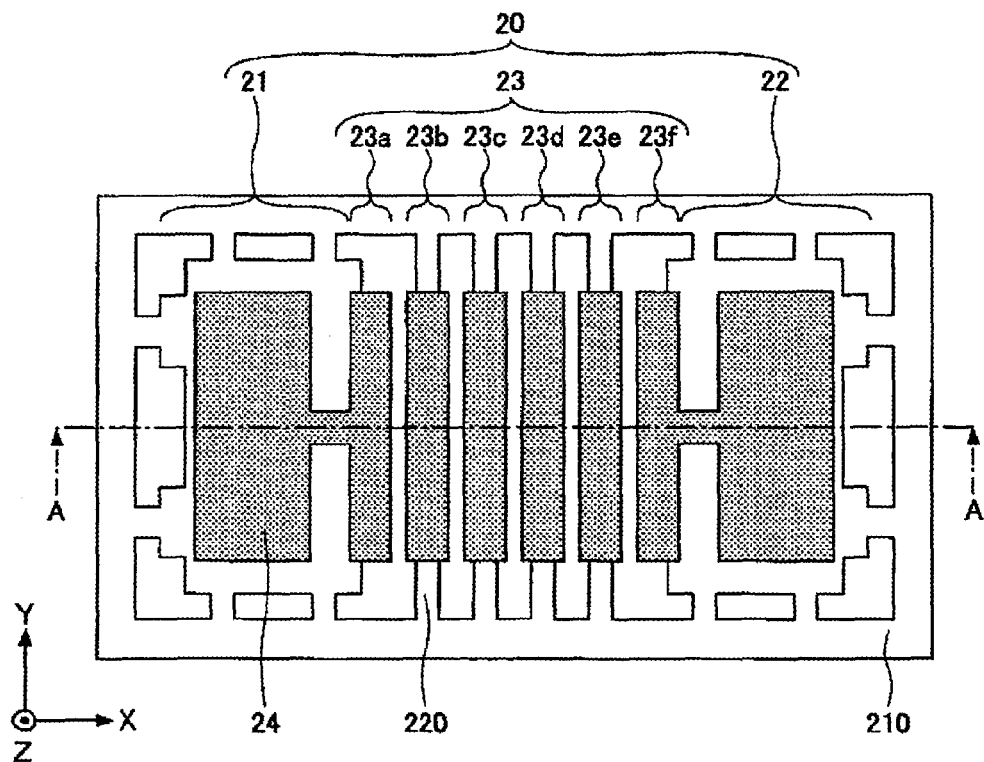
FIGS. 6A and 6B are views (#4) illustrating a process for manufacturing the package.
Figure 6B:
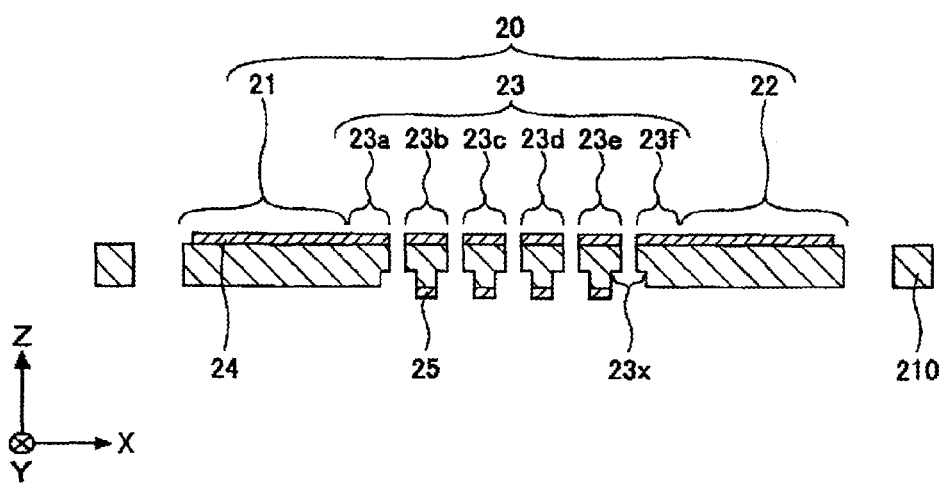

Next, in a process shown in FIGS. 6A and 6B, a plating film 24 is formed on a portion of one surface of each of portions that become the first electrode portion 21 and the second electrode portion 22, and on the whole of one surface of each of portions that become the elongate portions 23a to 23f. In addition, a plating film 25 is formed on the whole of the other surface of each of portions that become the elongate portions 23b to 23e.

The kind, thickness, or the like of the plating film 24 and 25 are as follows. The plating films 24 and 25 can be formed, for example, by an electrolytic plating method or the like after masking is performed on a portion where a plating film is not formed. In addition, in a case where the plating films 24 and 25 are formed by an electrolysis electroplating method, the frame portion 210 and the respective connecting portions 220 become feed lines.

Figure 7:
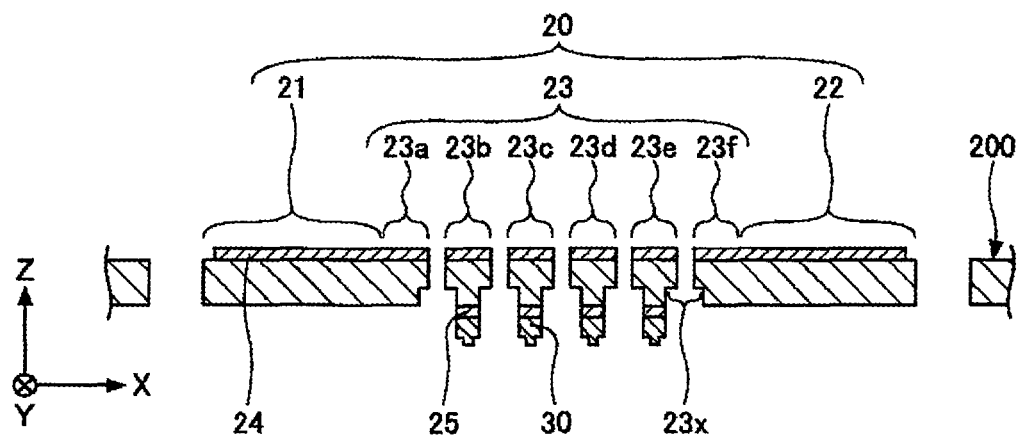
FIG. 7 is a view (#5) illustrating a process for manufacturing the package.

Next, in a process shown in FIG. 7, a plurality of bumps 30 is formed on the plating film 25 of the other surface of each of the elongate portions 23b to 23e along the longitudinal direction thereof. The plurality of bumps 30 can be formed, for example, by a wire-bonding apparatus, using a copper wire, a gold wire, or the like.

In addition, as for the bumps 30 that become heat dissipation paths, one bump is preferably formed directly below a portion on that each LED 110 is mounted. In a case where each bump 30 is formed by the wire-bonding apparatus, even if the portion (layout of each LED 110) on which each LED 110 is mounted is changed, this is suitable because the position where each bump 30 is formed can be easily changed simply by changing wire-bonding coordinates.

The planar shape of each bump 30 can be, for example, circular, and the diameter in that case can be, for example, about 10 to 250 μm. If each bump 30 is formed by the wire-bonding apparatus, a small-diameter projection portion 7 is formed on a tip portion (side opposite to the leadframe 20) of each bump 30. The height of the bump 30 also including the projection portion can be, for example, about 50 to 100 μm.

Figure 8:
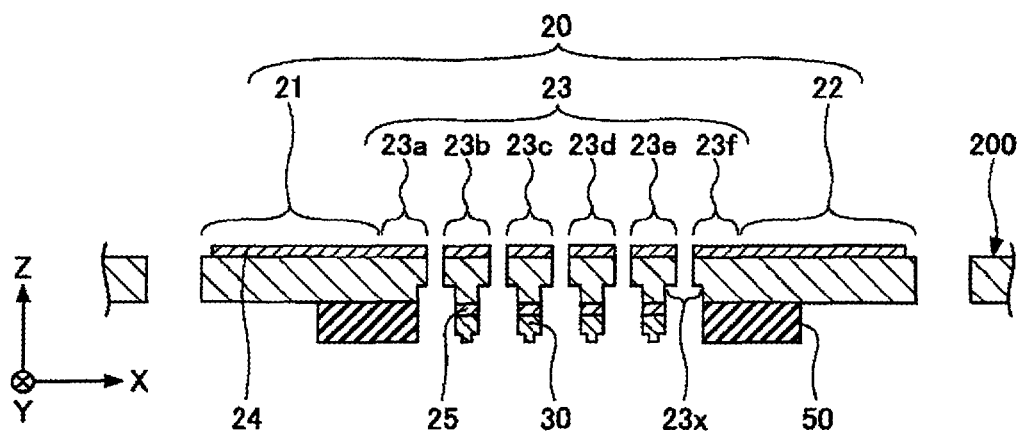
FIG. 8 is a view (#6) illustrating a process for manufacturing the package.

Next, in a process shown in FIG. 8, a bonding portion 50 is formed on the other surface of each of the portions that become the first electrode portion 21 and the second electrode portion 22. The bonding portion 50 can be formed, for example, by sticking an adhesive film made of heat-curable epoxy-based or silicone-based insulating resin or the like having stickiness, on the other surface of each of the portions that become the first electrode portion 21 and the second electrode portion 22.

Figure 9:
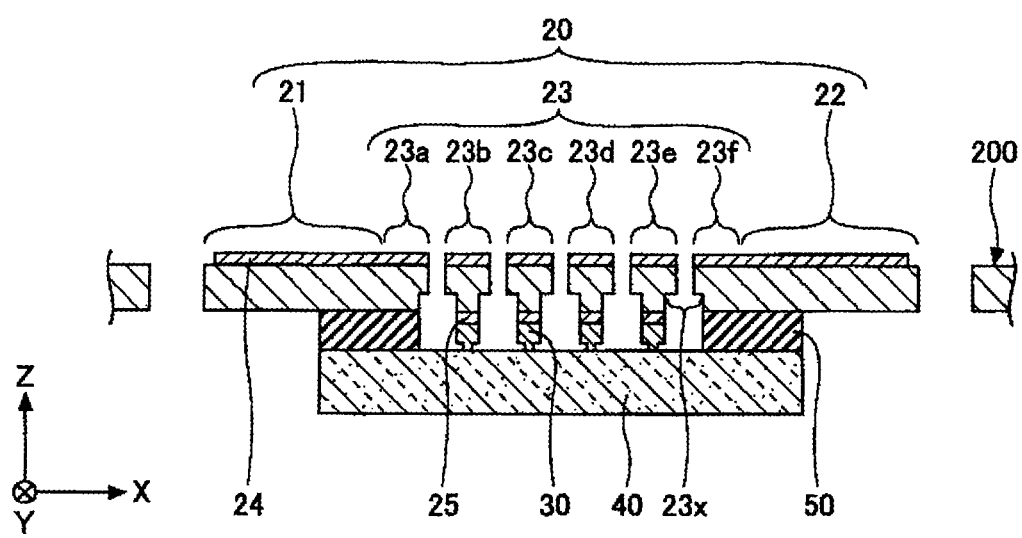
FIG. 9 is a view (#7) illustrating a process for manufacturing the package.

Next, in a process shown in FIG. 9, the heat sink 40 is stuck on the other surface side of the portion that becomes the leadframe 20 via the bonding portion 50. In this case, the heat sink 40 is arranged at a position that overlaps a portion that becomes the electronic component mounting portion 23 in plan view. That is, the electronic component mounting portion 23 is arranged on the heat sink 40.

As the material of the heat sink 40, a material with high thermal conductivity is preferably used. For example, ceramics, such as alumina ($Al_2O_3$) and aluminum nitride (AlN), or silicon (Si) having a surface coated with an insulating film, such as an oxidized film ($SiO_2$), can be used. The thickness of the heat sink 40 can be, for example, about several micrometers. However, in this process, the bonding portion 50 is not cured yet.

Figure 10:
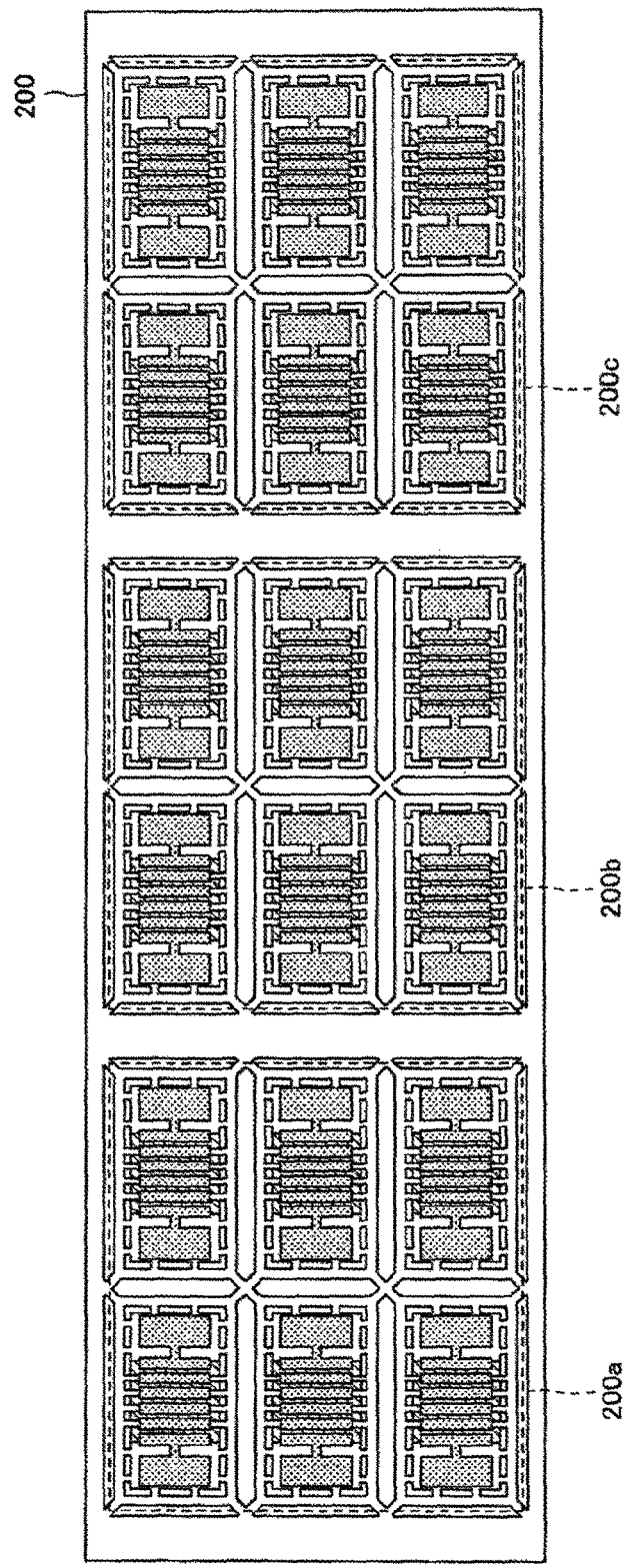
FIG. 10 is a view (#8) illustrating a process for manufacturing the package.
Figure 11:
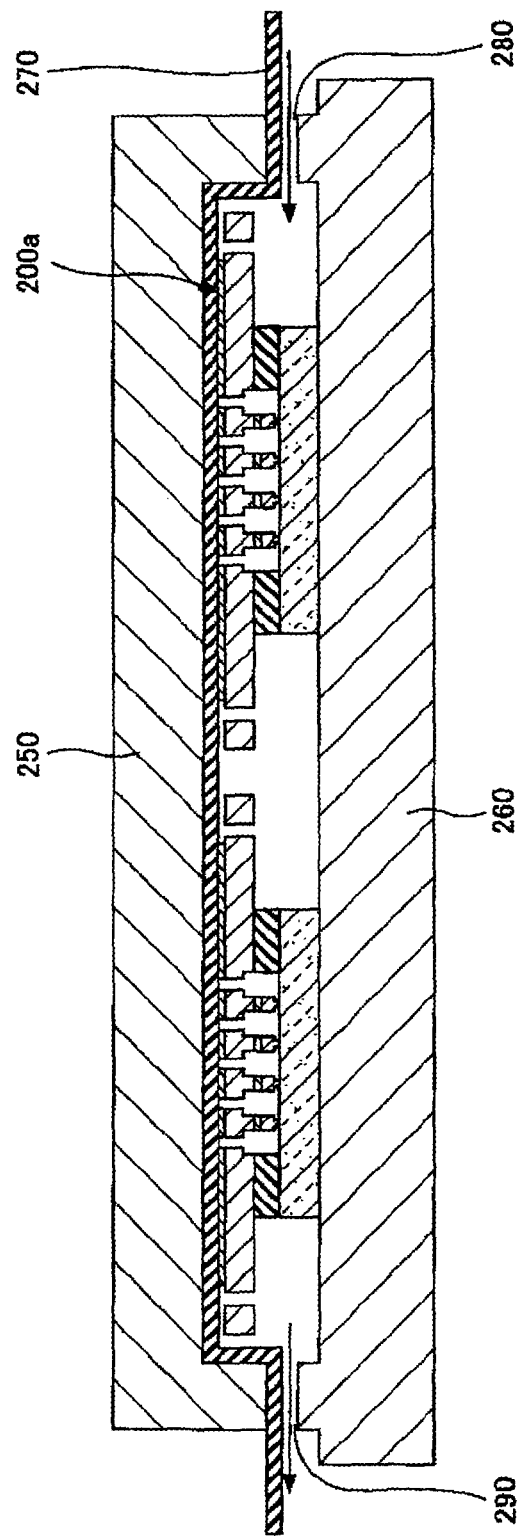
FIG. 11 is a view (#9) illustrating a process for manufacturing the package.
Figure 12:
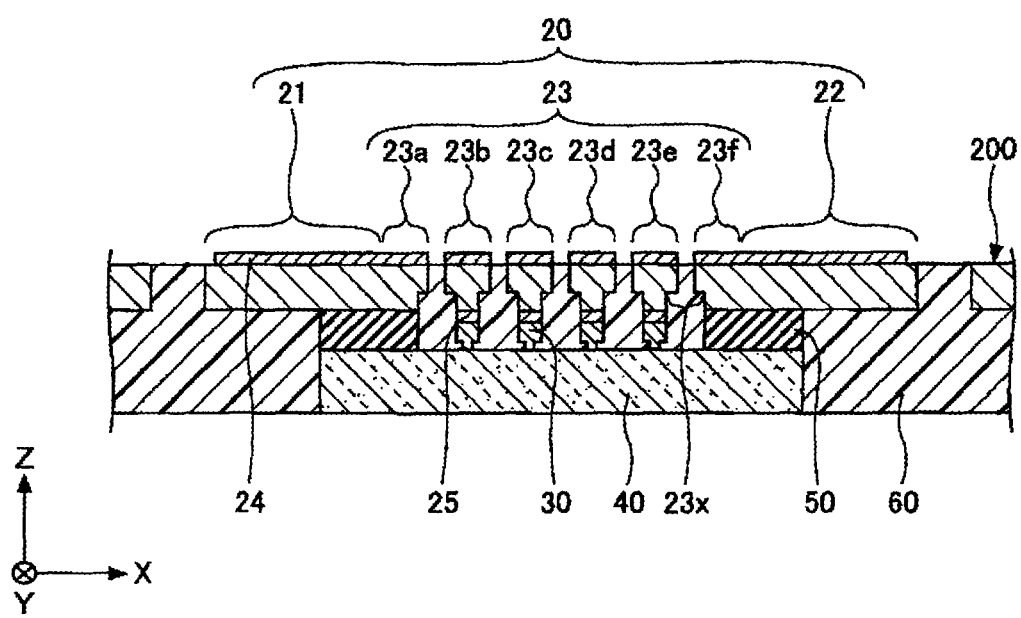
FIG. 12 is a view (#10) illustrating a process for manufacturing the package.

Next, in a process shown in FIGS. 10 to 12, the portion that becomes the leadframe 20, the bumps 30, the heat sink 40, and the bonding portion 50 are embedded in the resin portion 60. However, one surface (surface on which the plating film 24 is formed) of the portion that becomes the leadframe 20, and the other surface (surface that does not come in contact with the bumps 30) of the heat sink 40 are exposed from the resin portion 60.

As the material of the resin portion 60, for example, epoxy-based or silicone-based insulating resin, or the like can be used. The resin portion 60 may contain fillers, such as alumina. In addition, in a case where light emitting elements, such as LEDs, are mounted as electronic components, in order to raise the reflectance of the light emitted from the light emitting elements, it is suitable to make the resin portion 60 white by making fillers, such as titanium oxide, be contained therein. In addition, instead of titanium oxide, the resin portion 60 may be made white using a pigment of $TiO_2$, $BaSO_4$, or the like.

The resin portion 60 is molding resin, and can be formed, for example, by a transfer molding method, a compression molding method, or the like. Specifically, for example, the lead frame 200 is encapsulated in every three regions 200a to 200c shown in FIG. 10, to form the resin portion 60.

For example, only the portion of the region 200a of the leadframe 200, as shown in FIG. 11, is sandwiched by an upper mold 250 and a lower mold 260. However, a film 270 is formed on the surface of the upper mold 250. Then, resin is injected into a cavity formed by the upper mold 250 and the lower mold 260 from a gate 280, to form the resin portion 60. In addition, a vent 290 is a hole for discharging air.

The film 270 is a member provided in order to expose one surface of the region 200a of the leadframe 200 from the resin portion 60 and in order to improve the peelability from the upper mold 250 after the resin portion 60 is formed. In order to make the film 270 follow the internal shape of the upper mold 250, it is preferable to use resin films, such as a polyethylene terephthalate film and a polyimide film having flexibility. The thickness of the film 270 can be, for example, about 10 μm.

In addition, in this process, the tip of the projection portion of the bump 30 is pressure-welded to one surface of the heat sink 40 by the pressure caused by the molds when the resin portion 60 is formed. In addition, the bonding portion 50 is cured so that the heat sink 40 and the leadframe 20 are bonded to the bonding portion 50.

Figure 13A:
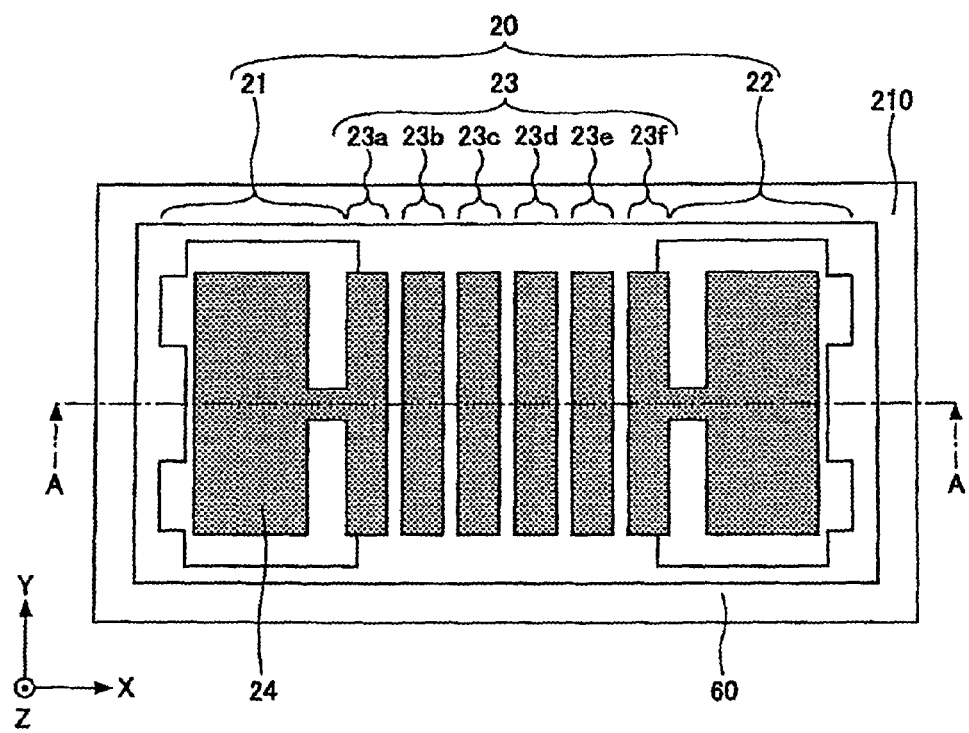
FIGS. 13A and 13B are views (#11) illustrating a process for manufacturing the package.
Figure 13B:
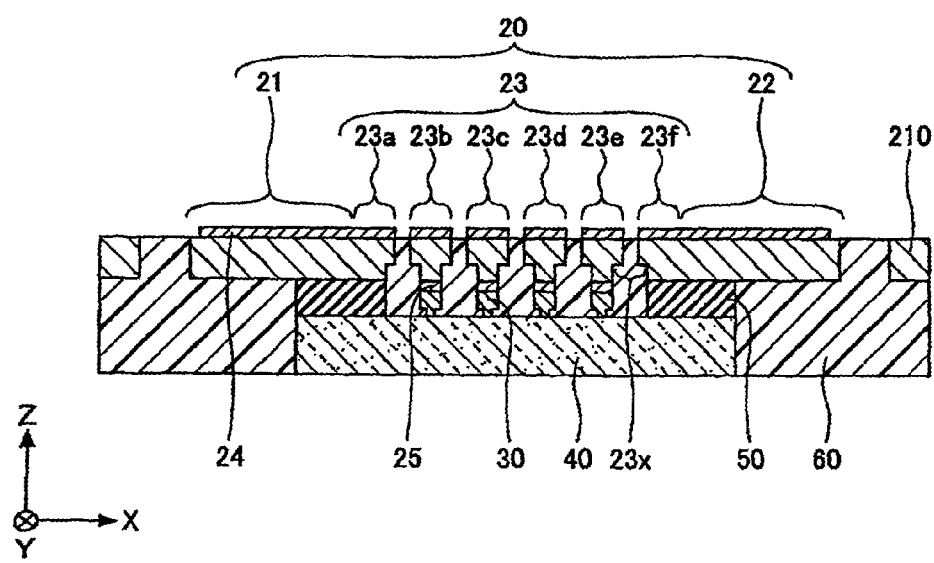

Next, the respective connecting portions 220 are removed in a process shown in FIGS. 13A and 13B. As mentioned above, since the thickness of each connecting portion 220 is made smaller than the thickness of other portions, the respective connecting portions 220 can be easily removed. The respective connecting portions 220 can be removed, for example, by masking and etching portions excluding the respective connecting portions 220. Otherwise, the respective connecting portions 220 can be mechanically cut, using a router, a die punch, a laser, or the like. This completes the leadframe 20. In addition, FIG. 13A is a plan view, and FIG. 13B is a cross-sectional view taken along line A-A of FIG. 13A.

Figure 14A:
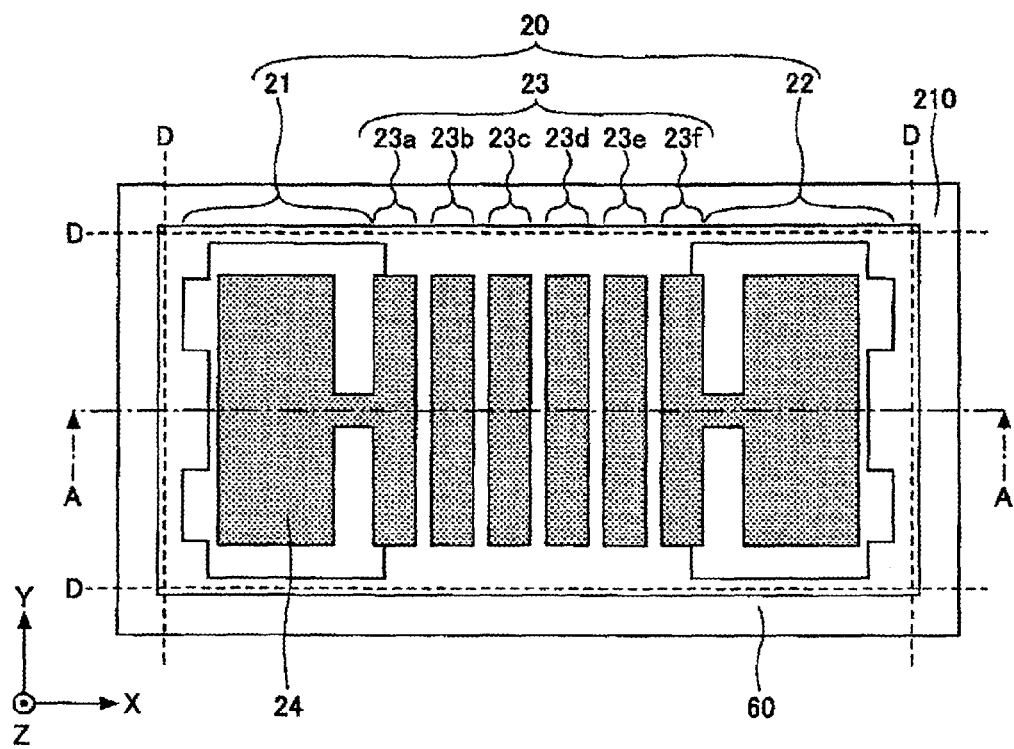
FIGS. 14A and 14B are views (#12) illustrating a process for manufacturing the package.
Figure 14B:
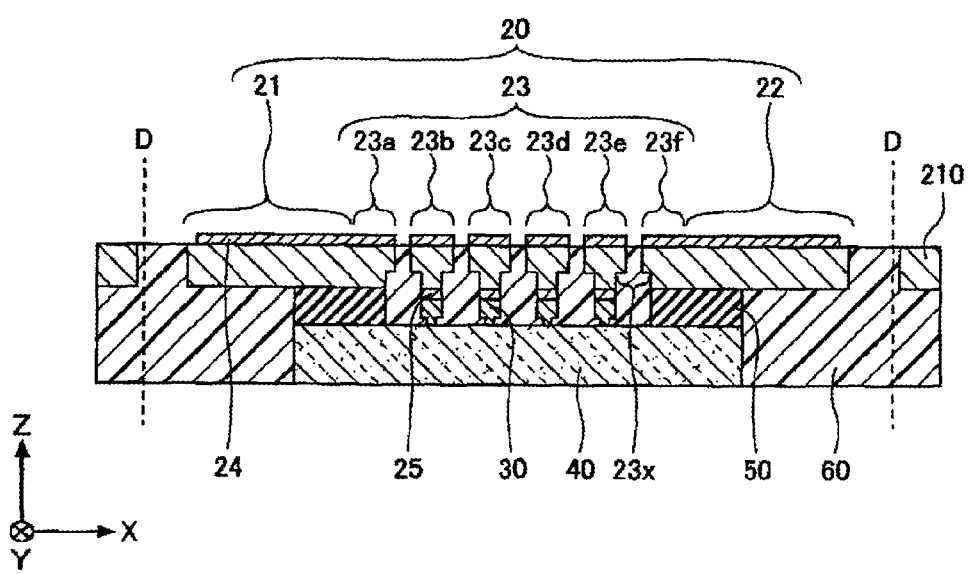

Next, in a process shown in FIGS. 14A and 14B, a plurality of packages 10 (refer to FIGS. 1A and 1B) for mounting electronic components is completed by cutting a structure shown in FIGS. 13A and 13B along broken lines D. The structure shown in FIGS. 13A and 13B can be cut, for example, by a dicing blade or the like. In addition, FIG. 14A is a plan view, and FIG. 14B is a cross-sectional view taken along line A-A of FIG. 14A.

As for the package 10 for mounting electronic components, the structure (single body of the package 10 for mounting electronic components) shown in FIGS. 1A and 1B may be shipped as one product, and the structure (a collection of the packages 10 for mounting electronic components) shown in FIGS. 13A and 13B may be shipped as one product.

In addition, the LED module 100 shown in FIGS. 2A and 2B can be formed by mounting a plurality of LEDs 110 on the package 10 for mounting electronic components and encapsulating the LEDs with the encapsulating resin 120, after the process shown in FIGS. 14A and 14B. However, the LED module 100 shown in FIGS. 2A and 2B may be formed by mounting the plurality of LEDs 110 on the portion that becomes each leadframe 20 of the structure shown in FIGS. 13A and 13B, performing encapsulating with the encapsulating resin 120, and then performing cutting along broken lines D shown in FIGS. 14A and 14B, after the process shown in FIGS. 13A and 13B.

In this way, since the package 10 for mounting electronic components according to the present embodiment can mount a number of LEDs 110 in a state where the LEDs are longitudinally and laterally arranged, it is possible to realize the LED module 100 that has either the first electrode portion 21 or the second electrode portion 22 as an anode electrode and has the other as a cathode electrode. For example, about several tens to several hundreds of LEDs 110 can be mounted on the package 10 for mounting electronic components; for example, the LED module 100 of a high output of about 7 W to 13 W can be realized.

Incidentally, in the high-output LED module 100 as described above, the amount of heat radiation increases because all the LEDs 110 mounted on the package 10 for mounting electronic components emit light simultaneously. Although heat dissipation properties are improved if the leadframe 20 is made thick, this alone is not enough.

Thus, in the package 10 for mounting electronic components, the bump 30 that becomes a heat dissipation path is formed directly below each LED 110, the heat emitted from each LED 110 is transferred to the heat sink 40 via the bump 30, and the heat is dissipated from the other surface of the heat sink 40 exposed from the resin portion 60. Accordingly, even if a number of LEDs 110 are mounted on the package 10 for mounting electronic components and are made to light emit simultaneously, the temperature of each LED 110 can be made to fall within a guaranteed operational temperature range.

In addition, since the thickness of the leadframe 20 or the thickness of the heat sink 40 can be freely set in the package 10 for mounting electronic components according to the present embodiment, heat dissipation performance is easily controlled. Therefore, the number of LEDs 110 to be mounted can be relatively freely selected and it is possible to cope with a wide range of applications.

Second Embodiment

An example of the structure of a package for mounting electronic components different from the first embodiment is shown in the second embodiment. In addition, in the second embodiment, description regarding the same component parts as the embodiment already described is omitted.

Figure 15A:
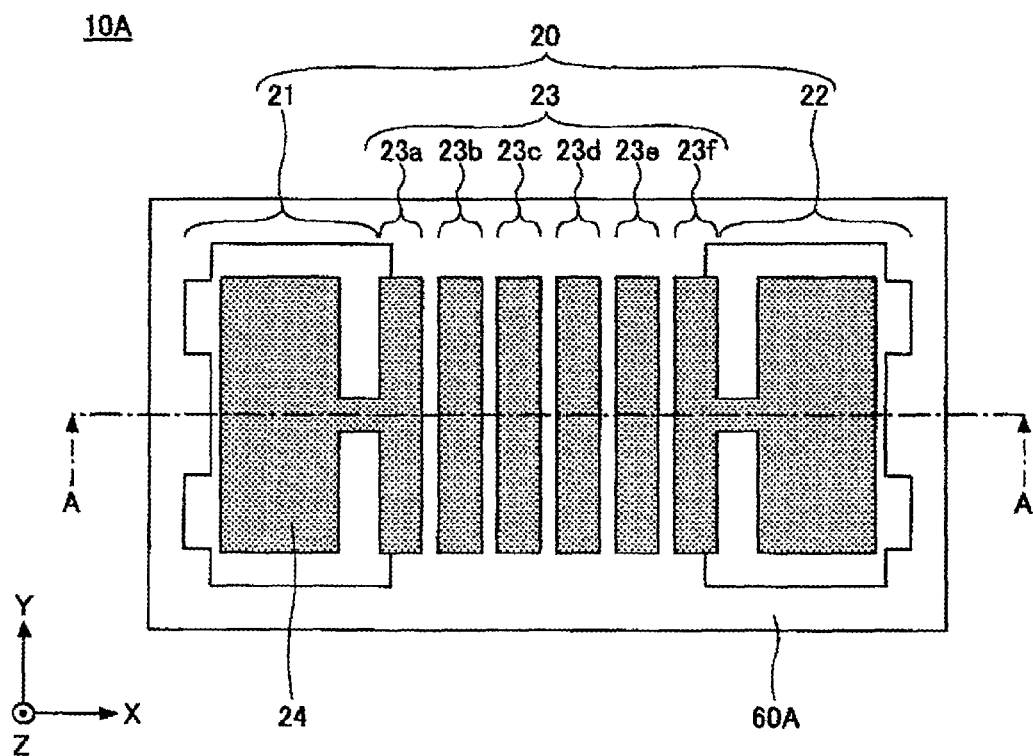
FIGS. 15A and 15B are views illustrating a package for mounting electronic components according to a second embodiment.
Figure 15B:
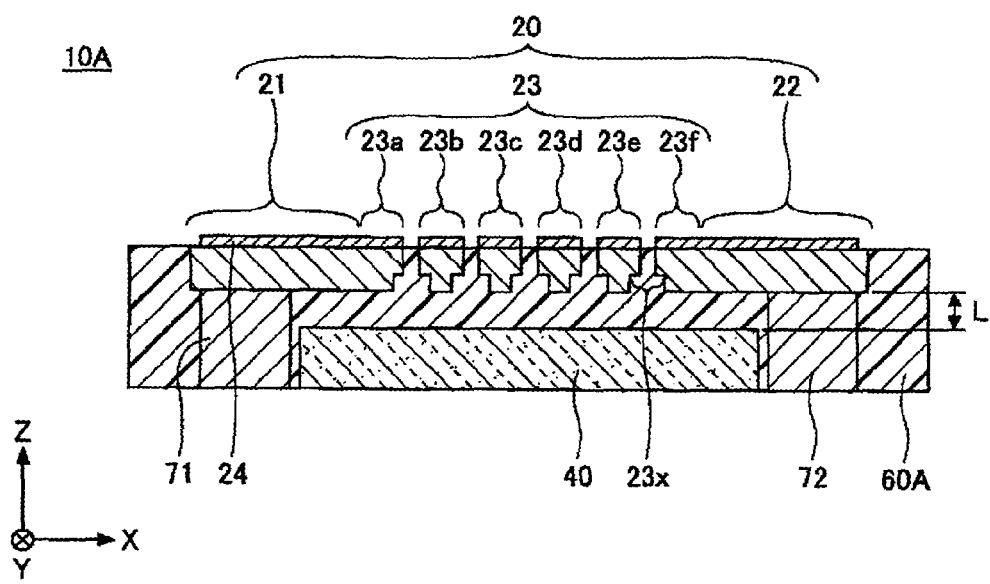

FIGS. 15A and 15B are views illustrating the package for mounting electronic components according to the second embodiment, FIG. 15A is a plan view, and FIG. 15B is a cross-sectional view along line A-A of FIG. 15A. Referring to FIGS. 15A and 15B, a package 10A for mounting electronic components is different from the package 10 (refer to FIG. 1) for mounting electronic components in that the plating film 25, the bumps 30, and the bonding portion 50 are omitted, in that the resin portion 60 is replaced with a resin portion 60A, and in that mounting terminals 71 and 72 are added.

In the package 10A for mounting electronic components, the plating film 25 and the bumps 30 that become heat dissipation paths from the leadframe 20 to the heat sink 40 are not present. Therefore, it is necessary to make the interval L between the bottom surface of the leadframe 20 and the top surface of the heat sink 40 as narrow as possible without using the bonding portion 50 and to secure heat dissipation properties. In order to secure heat dissipation properties, the interval L is preferably set to about 0.1 mm or less.

In the second embodiment, since the bumps 30 are not formed, it is not necessary to take into consideration the insulation between the leadframe 20 and the heat sink 40. Accordingly, as the material of the heat sink 40, metals, such as copper, copper alloys, aluminum, and aluminum alloys, can be used. Of course, similarly to the first embodiment, as the material of the heat sink 40, a material with high thermal conductivity is preferably used. For example, ceramics, such as alumina ($Al_2O_3$) and aluminum nitride (AlN), or silicon (Si) having a surface coated with an insulating film, such as an oxidized film ($SiO_2$), can be used. The thickness of the heat sink 40 can be, for example, about 300 μm (about 100 to 500 μm).

As the resin portion 60A, it is preferable to select a material with high thermal conductivity. Thermal conductivity of the resin portion 60A is preferably 1 W/mK or more and more preferably 3 W/mK or more. If thermal conductivity of the resin portion 60A is about 3 to 5 W/mK, a thermal resistance value comparable to a package for mounting electronic components having alumina ceramics as a base substance can be obtained. In addition, the breakdown voltage of the resin portion 60A is preferably 4 kV or more.

An example of the materials that can realize the above characteristics may include a material in which a polyimide-based insulating resin is mixed with an epoxy-based insulating resin, and the mixture is made to contain an alumina ($Al_2O_3$) filler. By adjusting a ratio in which both the resins are mixed and the content of the filler, a predetermined thermal conductivity or a predetermined breakdown voltage can be realized. In addition, a material may be used in which the polyimide-based insulating resin is made to contain a boron nitride (BN) filler.

The package 10A for mounting electronic components is provided with mounting terminals 71 and 72. The mounting terminal 71 passes through the resin portion 60A and is electrically connected to the first electrode portion 21. In addition, the mounting terminal 72 passes through the resin portion 60A and is electrically connected to the second electrode portion 22. The rear surface of each of the mounting terminals 71 and 72 is exposed from the resin portion 60A.

The leadframe 20 in which the mounting terminals 71 and 72 are provided at the first electrode portion 21 and the second electrode portion 22, respectively, can be formed by etching a metal sheet from both surfaces.

In addition, the heat sink 40 and the electronic component mounting portion 23 can be integrally formed by the resin portion 60A by arranging the heat sink 40 within the cavity of the lower mold of a mold, arranging the leadframe 20 above the heat sink, and holding the leadframe 20 with the upper mold and the lower mold, to thereby perform resin molding.

The package 10A for mounting electronic components can be surface-mounted on a wiring substrate or the like by electrically connecting the mounting terminals 71 and 72 to the first electrode portion 21 and the second electrode portion 22, respectively, and exposing the rear surface of each mounting terminal from the resin portion 60A. For example, the rear surface of each of the mounting terminals 71 and 72 can be bonded a pad on the wiring substrate via a solder material.

In this way, by narrowing the interval between the leadframe 20 and the heat sink 40 and using a material with high thermal conductivity for the resin portion 60A, predetermined heat dissipation performance can be realized even if the plating film 25 and the bumps 30 are not provided.

In addition, the package 10A for mounting electronic components can be surface-mounted on a wiring substrate or the like by being electrically connected with the first electrode portion 21 and the second electrode portion 22 and providing the mounting terminals 71 and 72 exposed from the rear surface side of the resin portion 60A.

Third Embodiment

Another example of the structure of a package for mounting electronic components different from the first embodiment is shown in a third embodiment. In addition, in the third embodiment, description regarding the same component parts as the embodiments already described is omitted.

Figure 16A:
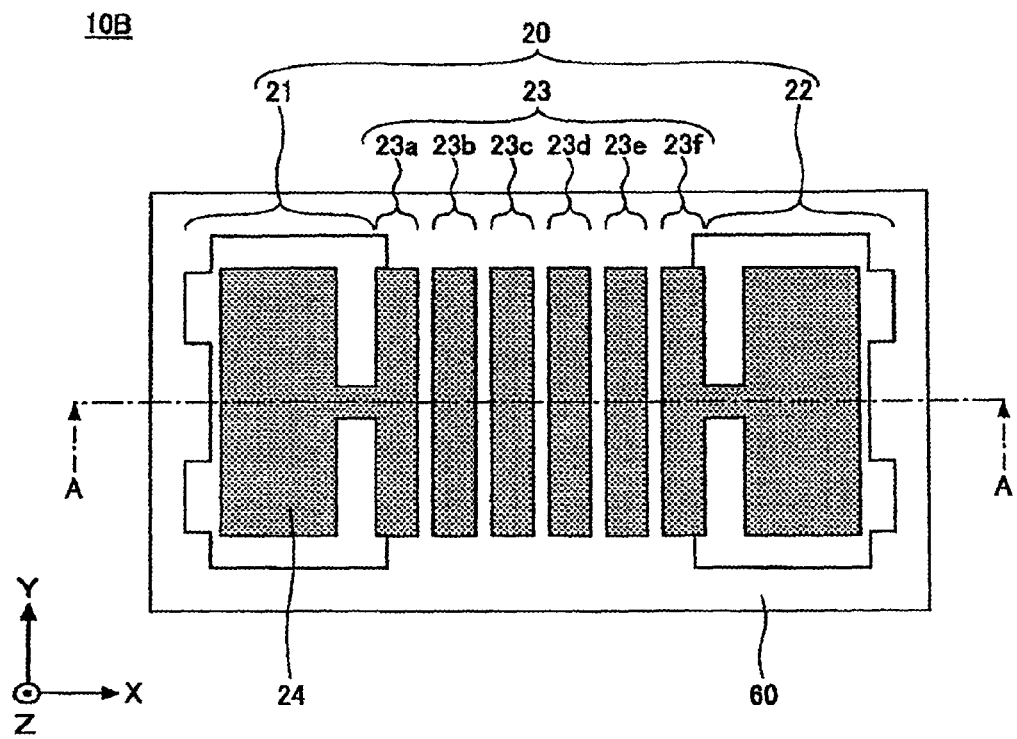
FIGS. 16A and 16B are views illustrating a package for mounting electronic components according to a third embodiment.
Figure 16B:
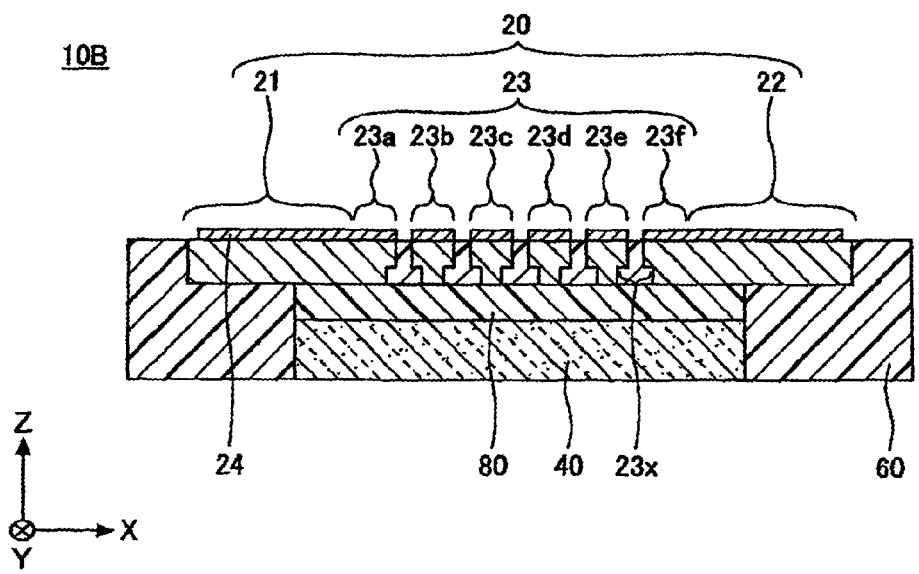

FIGS. 16A and 16B are views illustrating the package for mounting electronic components according to the third embodiment, FIG. 16A is a plan view, and FIG. 16B is a cross-sectional view along line A-A of FIG. 16A. Referring to FIGS. 16A and 16B, a package 10B for mounting electronic components is different from the package 10 (refer to FIG. 1) for mounting electronic components in that the plating film 25, the bumps 30, and the bonding portion 50 are omitted and in that a high thermal conducting material 80 is added.

In the package 10B for mounting electronic components, a high thermal conductivity material 80 made of an insulating material is provided as a heat dissipation path from the leadframe 20 to the heat sink 40, instead of the plating film 25 and the bumps 30. The high thermal conductivity material 80 is arranged so as to come in contact with the electronic component mounting portion 23 and the heat sink 40. In addition, since the high thermal conductivity material 80 also functions as the bonding portion 50, the bonding portion 50 becomes unnecessary.

A thermal conductivity of the high thermal conductivity material 80 is preferably 1 W/mK or more and more preferably 3 W/mK or more. An example of the materials that can realize the above characteristics may include the same material as the resin portion 60A of the second embodiment. In addition, it is not necessary to use the same high thermal conductivity material as the resin portion 60A for the material of the resin portion 60. For example, an epoxy-based or silicone-based insulating resin or the like having a lower thermal conductivity than the high thermal conductivity material 80 can be used.

In the third embodiment, since the bumps 30 are not formed, it is not necessary to take into consideration the insulation between the leadframe 20 and the heat sink 40. Accordingly, as the material of the heat sink 40, metals, such as copper, copper alloys, aluminum, and aluminum alloys, can be used. Of course, similarly to the first embodiment, as the material of the heat sink 40, ceramics, such as alumina ($Al_2O_3$) and aluminum nitride (AlN), or silicon (Si) having a surface coated with an insulating film, such as an oxidized film ($SiO_2$), can be used. The thickness of the heat sink 40 can be, for example, 300 μm (about 100 to 500 μm).

The package 10B for mounting electronic components can be prepared by bonding the leadframe 20 and the heat sink 40 using an adhesive film of an insulating material that becomes the high thermal conductivity material 80, and then forming the resin portion 60.

In this way, even if the high thermal conductivity material 80 is provided directly below each LED 110 as a heat dissipation path instead of the plating film 25 and the bumps 30, the heat emitted from each LED 110 can be efficiently transferred to the heat sink 40 via the high thermal conductivity material 80. Accordingly, the same effects as the first embodiment are exhibited.

Fourth Embodiment

Still another example of the structure of a package for mounting electronic components different from the first embodiment is shown in a fourth embodiment. In addition, in the fourth embodiment, description regarding the same component parts as the embodiments already described is omitted.

Figure 17A:
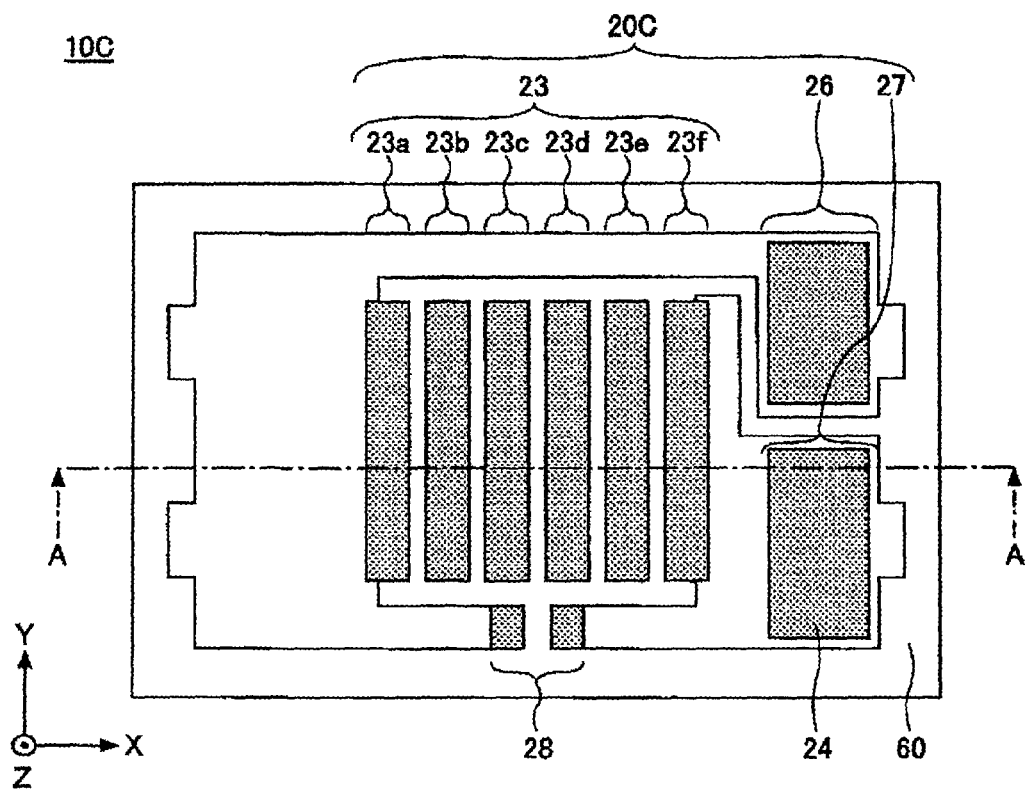
FIGS. 17A and 17B are views illustrating a package for mounting electronic components according to a fourth embodiment.
Figure 17B:
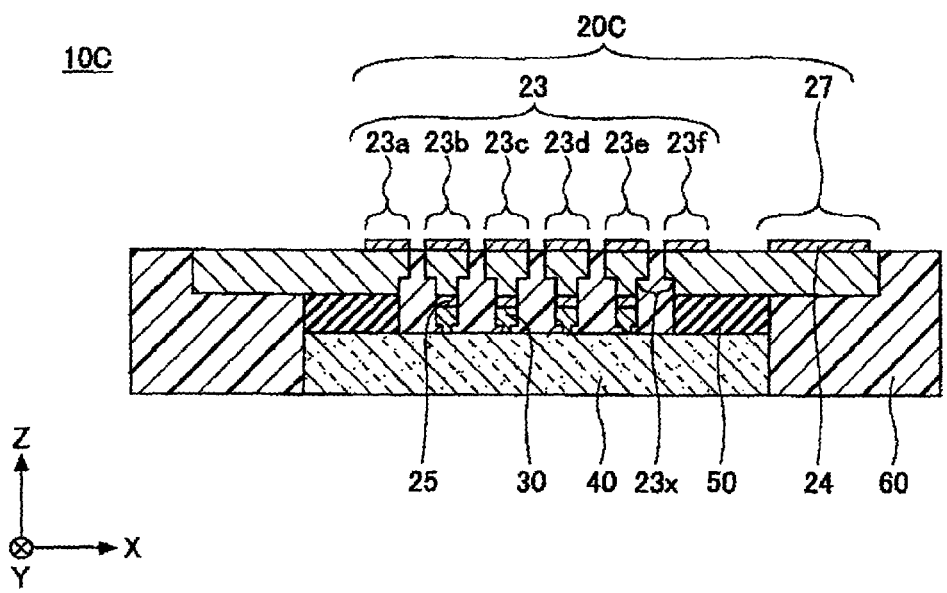

FIGS. 17A and 17B are views illustrating the package for mounting electronic components according to the fourth embodiment, FIG. 17A is a plan view, and FIG. 17B is a cross-sectional view along line A-A of FIG. 17A. Referring to FIG. 17, a package 10C for mounting electronic components is different from the package 10 (refer to FIG. 1) for mounting electronic components in that the first electrode portion 21 and the second electrode portion 22 are replaced with a first electrode portion 26 and a second electrode portion 27, respectively, and in that an electronic component mounting portion 28 is added separately from the electronic component mounting portion 23.

In the package 10 for mounting electronic components, the first electrode portion 21 and the second electrode portion 22 are arranged on both sides of the electronic component mounting portion 23 (refer to FIG. 1). On the other hand, in the package 10C for mounting electronic components, the first electrode portion 26 and the second electrode portion 27 are arranged on one side of the electronic component mounting portion 23.

The first electrode portion 26 electrically connected to the elongate portion 23a of the electronic component mounting portion 23 is machined in a predetermined shape, and extends to a position adjacent to the second electrode portion 27. In this way, two electrode portions may be arranged on both sides of the electronic component mounting portion 23 or may be arranged on one side of the electronic component mounting portion 23.

The electronic component mounting portion 28 has two lands, one land is connected to the first electrode portion 26, and the other land is connected to the second electrode portion 27. That is, the electronic component mounting portion 28 is connected in parallel to the first electrode portion 26 and the second electrode portion 27. For example, zener diodes or the like can be mounted on the electronic component mounting portion 28.

In a case where the zener diodes are mounted, a land connected to the first electrode portion 26 and a land connected to the second electrode portion 27 are mounted such that a land with higher potential becomes the cathode side and a land with lower potential becomes the anode side. By mounting the zener diodes between the first electrode portion 26 and the second electrode portion 27, the voltage between the first electrode portion 26 and the second electrode portions 27 can be prevented from becoming a predetermined voltage (zener voltage) or more, and the respective LEDs 110 mounted on the electronic component mounting portion 23 can be protected.

As such, there is no restriction on the layout of the first electrode portion and the second electrode portion, and the electrode portions can be arranged at arbitrary positions, respectively. In addition, the electronic component mounting portion 28 connected in parallel to the first electrode portion and the second electrode portion can be provided.

Application Example of LED Module

Here, an application example of the LED module 100 shown in FIGS. 2A and 2B is shown. In addition, in the application example of the LED module, description regarding the same component parts as the embodiments already described is omitted.

Figure 18:
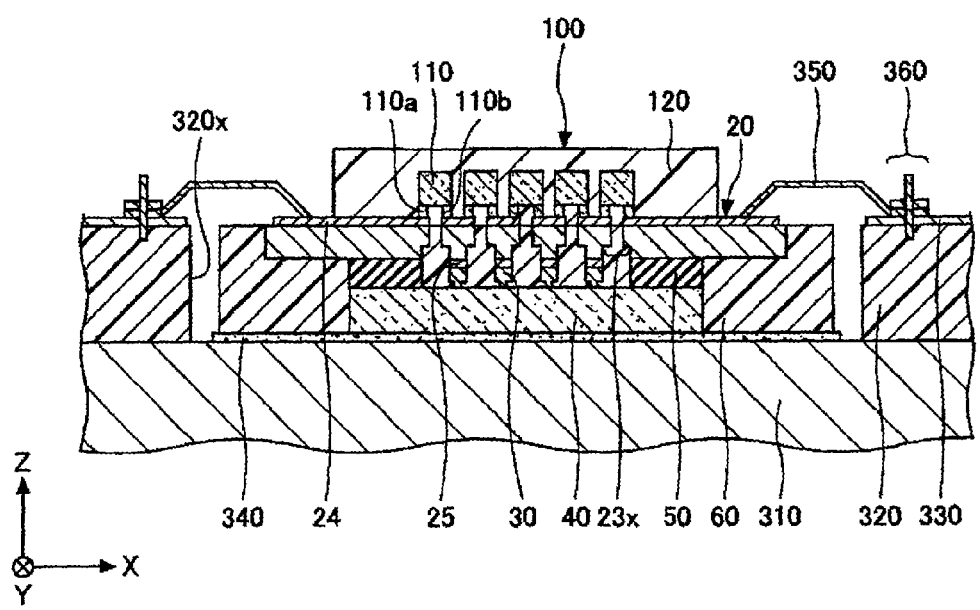
FIG. 18 is a view (#1) illustrating an LED mounting substrate mounting an LED module thereon.

FIG. 18 is a view (#1) illustrating an LED mounting substrate mounting the LED module thereon. Referring to FIG. 18, in the LED mounting substrate 300, an insulating layer 320 made of epoxy-based resin that has an LED module accommodating portion 320x is formed on a metal sheet 310, such as an aluminum sheet, and a wiring pattern 330 made of copper (Cu) or the like is formed on the insulating layer 320.

The LED module 100 is anchored onto the metal sheet 310 exposed to the inside of the LED module accommodating portion 320x, via a bonding layer 340, such as silicone grease. The first electrode portion 21 and the second electrode portion 22 of the LED module 100 are connected to the predetermined wiring pattern 330 via a spring-like lead pin 350 and a lead pin fixing portion 360, respectively. The heat emitted from the LED module 100 is dissipated to the metal sheet 310.

Figure 19:
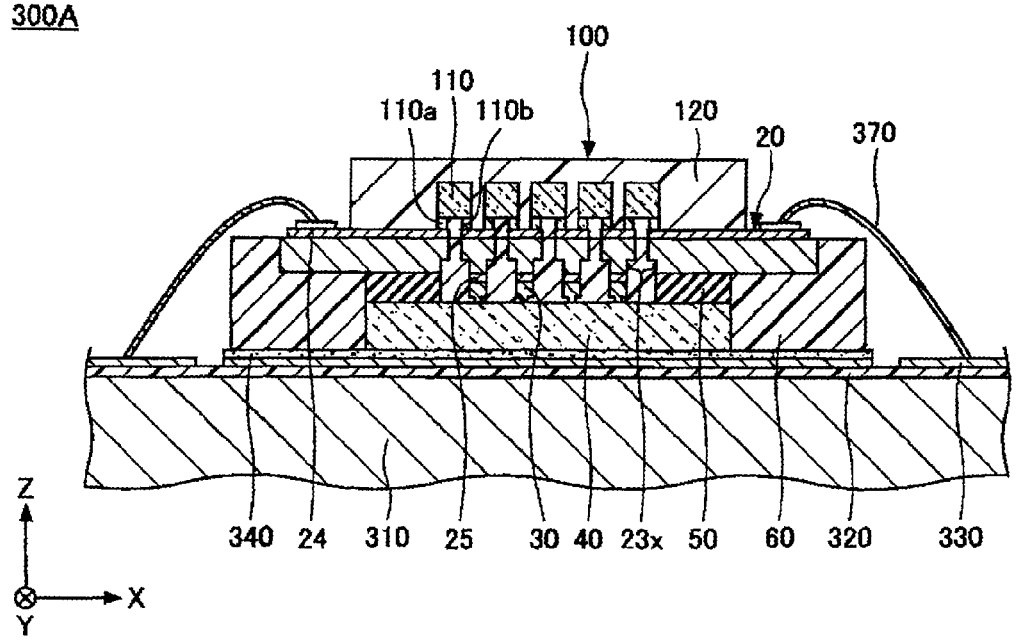
FIG. 19 is a view (#2) illustrating the LED mounting substrate.

FIG. 19 is a view (#2) illustrating the LED mounting substrate mounting the LED module thereon. Referring to FIG. 19, in an LED mounting substrate 300A, the insulating layer 320 made of epoxy-based resin is formed on the metal sheet 310, and the wiring pattern 330 made of copper (Cu) or the like is formed on the insulating layer 320. In addition, the LED module accommodating portion 320x is not provided on the insulating layer 320.

The LED module 100 is anchored onto the predetermined wiring pattern 330 via the bonding layers 340, such as silicone grease. The first electrode portion 21 and the second electrode portion 22 of the LED module 100 are connected to the predetermined wiring pattern 330 via bonding wires 370, respectively. By forming the insulating layer 320 to be thin, the heat emitted from the LED module 100 is dissipated to the metal sheet 310 via the insulating layer 320.

Figure 20:
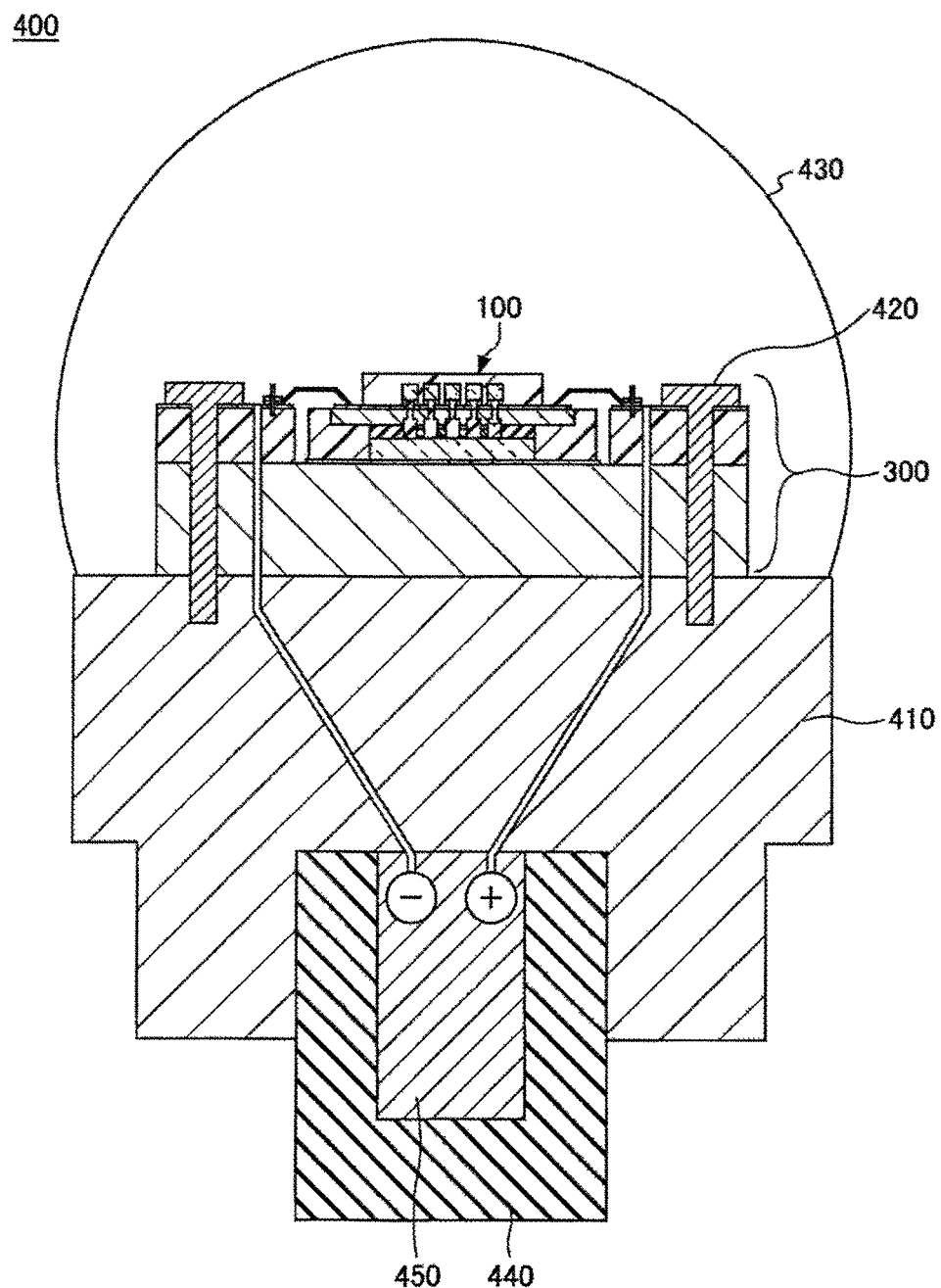
FIG. 20 is a view illustrating an electric bulb type illuminator using the LED mounting substrate shown in FIG. 18.

FIG. 20 is a view illustrating an electric bulb type illuminator using the LED mounting substrate shown in FIG. 18. Referring to FIG. 20, in the electric bulb type illuminator 400, the LED mounting substrate 300 is fixed onto an aluminum die-cast 410 by a screw 420, and is covered with a light-transmissive cover 430, such as glass.

A cap portion 440 and a power circuit 450 are provided opposite to a side where the LED mounting substrate 300 of the aluminum die-cast 410 is fixed. A portion of the cap portion 440 protrudes from the aluminum die-cast 410. A positive electrode of the power circuit 450 is connected to any one of the first electrode portion 21 and the second electrode portion 22 via the wiring pattern 330 of the LED mounting substrate 300. In addition, a negative electrode of the power circuit 450 is connected to the other of the first electrode portion 21 and the second electrode portion 22 via the wiring pattern 330 of the LED mounting substrate 300.

By attaching the cap portion 440 to a predetermined mouthpiece and supplying electric power to the power circuit 450, a current can be applied between the first electrode portion 21 and the second electrode portion 22 via the wiring pattern 330 of the LED mounting substrate 300 from the power circuit 450. That is, the respective LEDs 110 of the LED module 100 can be turned on.

In this way, the electric bulb type illuminator 400 can be realized using the LED mounting substrate 300 mounting the LED module 100. In addition, the LED mounting substrate 300A may be used instead of the LED mounting substrate 300.

Although the preferred embodiments has been described above, the invention is not limited to the above-described embodiments, and various modifications and substitutions can be added to the above-described embodiments without departing from the scope set forth in the claims.

For example, the mounting terminals 71 and 72 may be provided in the first, third, and fourth embodiments. In addition, the electronic component mounting portion 28 may be provided in the first to third embodiments.

What is claimed is:

1. A package for mounting a plurality of electronic components, the package comprising:
a leadframe made of conductive material and on which the plurality of electronic components are to be mounted, the leadframe comprising a first surface and a second surface opposite to the first surface and comprising a plurality of elongate portions arranged in parallel to each other with a gap interposed between the adjacent elongate portions;
a heat sink comprising a first surface and a second surface opposite to the first surface, wherein the leadframe is disposed above the heat sink such that the second surface of the leadframe faces the first surface of the heat sink; and
a resin portion, wherein the leadframe and the heat sink are embedded in the resin portion such that the first surface of the leadframe and the second surface of the heat sink are exposed from the resin portion, respectively, wherein the respective gaps between the adjacent elongate portions are filled with the resin portion.

2. The package of claim 1, wherein the elongate portions are formed in a rectangular shape, and are arranged in parallel to each other such that long sides of the adjacent elongate portions face each other.

3. The package of claim 1,
wherein one surface of the resin portion is substantially flush with the exposed first surface of the leadframe, and
wherein the other surface of the resin portion is substantially flush with the exposed second surface of the heat sink.

4. The package of claim 1, wherein the leadframe is configured such that the plurality of electronic components are arranged on the respective gaps between the adjacent elongate portions in parallel along a longitudinal direction of the elongate portions.

5. The package of claim 1, further comprising:
a plurality of bumps each provided on a corresponding one of the elongate portions and coming contact with the first surface of the heat sink.

6. The package of claim 5, wherein each of the bumps comprises a projection portion coming contact with the first surface of the heat sink.

7. The package of claim 1, further comprising:
a high thermal conductivity material disposed between the leadframe and the heat sink so as to come contact with the second surface of the leadframe and the first surface of the heat sink, wherein the thermal conductivity of the high thermal conductivity material is higher than that of the resin portion.

8. The package of claim 1, wherein the leadframe further comprises:
a first electrode portion electrically connected to one of the elongate portions located at one end thereof in an array direction where the elongate portions are arranged in parallel; and
a second electrode portion electrically connected to another one of the elongate portions located at the other end thereof in the array direction.

9. The package of claim 8, further comprising:
a first mounting terminal provided on the second surface of the first electrode portion of the leadframe and embedded in the resin portion such that one surface of the first mounting terminal is exposed from the resin portion; and
a second mounting terminal provided on the second surface of the second electrode portion of the leadframe and embedded in the resin portion such that one surface of the second mounting terminal is exposed from the resin portion.

10. The package of claim 8, wherein the first electrode portion and the second electrode portion are arranged to face either said one of the elongate portions or said another one of the elongate portions.

11. The package of claim 8, wherein the leadframe further comprises:
a third electrode portion electrically connected to the first electrode portion and the second electrode portion and on which another electrode component is to be mounted.

12. The package of claim 1, wherein a plating film is formed on the first surface of the elongate portions of the leadframe.

13. An electronic apparatus comprising:
a plurality of electronic components; and
the package of claim 4 that mounts the plurality of electronic components thereon.

14. The electronic apparatus of claim 13, wherein the plurality of electronic components are light emitting diodes (LEDs).

* * * * *